United States Patent [19]
Ohkase

[11] Patent Number: 5,393,349
[45] Date of Patent: Feb. 28, 1995

[54] SEMICONDUCTOR WAFER PROCESSING APPARATUS

[75] Inventor: Wataru Ohkase, Sagamihara, Japan

[73] Assignee: Tokyo Electron Sagami Kabushiki Kaisha, Japan

[21] Appl. No.: 126,755

[22] Filed: Sep. 27, 1993

Related U.S. Application Data

[63] Continuation of Ser. No. 928,018, Aug. 11, 1992, abandoned.

[30] Foreign Application Priority Data

Aug. 16, 1991 [JP] Japan .................................. 3-229697
Jan. 14, 1992 [JP] Japan .................................. 4-023402

[51] Int. Cl.$^6$ ............................................. C23C 16/00
[52] U.S. Cl. ..................................... 118/725; 118/728; 118/500
[58] Field of Search ..................... 118/725, 728, 500

[56] References Cited

U.S. PATENT DOCUMENTS 2,890,976  7/1959  Lehovec ..................... 257/618
4,733,631  3/1988  Boyarsky ................... 118/715
5,148,714  9/1992  McDiarmid ................ 118/725

OTHER PUBLICATIONS

E. Bassous et al., "Fabrication of Dense Arrays of Hozzles and Channels with High Degree of Precision", *IBM Technical Disclosure Bulletin*, vol. 19 (Nov. 1976) pp. 2243–2246.

R. A. Leone, et al., "Fabricating Shaped Grid and Aperture Holes", *IBM Technical Disclosure Bulletin*, vol. 14 (Jul. 1971) pp. 417–418.

*Primary Examiner*—Richard Bueker
*Attorney, Agent, or Firm*—Beveridge, DeGrandi, Weilacher & Young

[57] ABSTRACT

The present invention relates to semiconductor wafers which have a through hole formed at their center portion. A processing apparatus provided with a conveyor means including a wafer holder having a holding protrusion which engages with this through hole implements oxidation and dispersion processing or CVD processing to a processing surface of a semiconductor wafer so that a semiconductor wafer can have heat treatment performed without accompanying film growth faults or heat distortion.

7 Claims, 13 Drawing Sheets

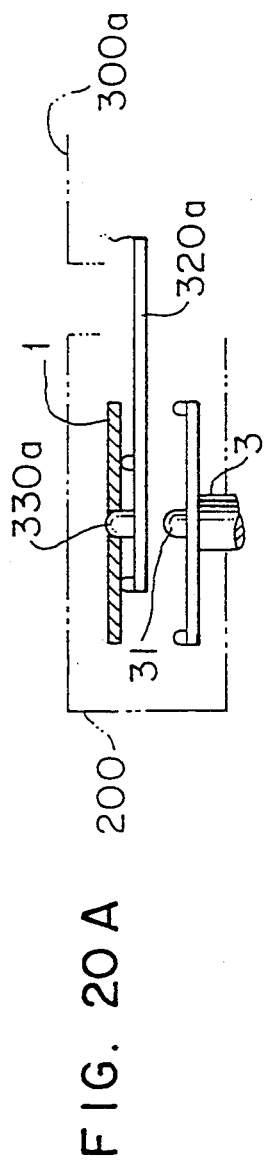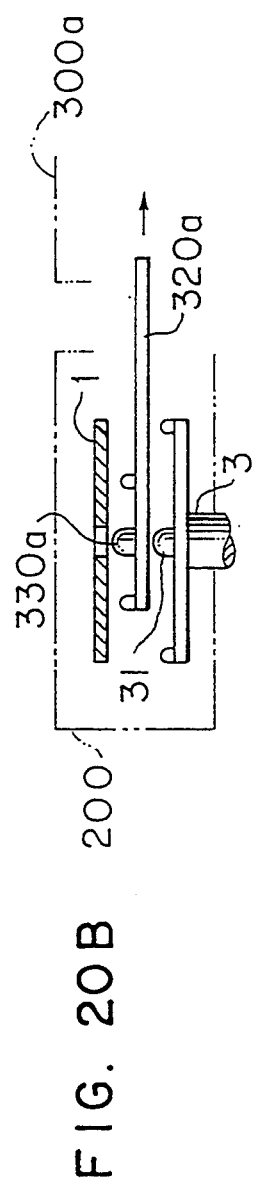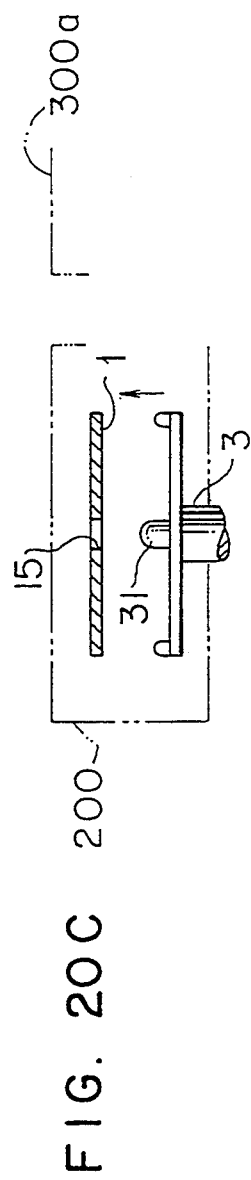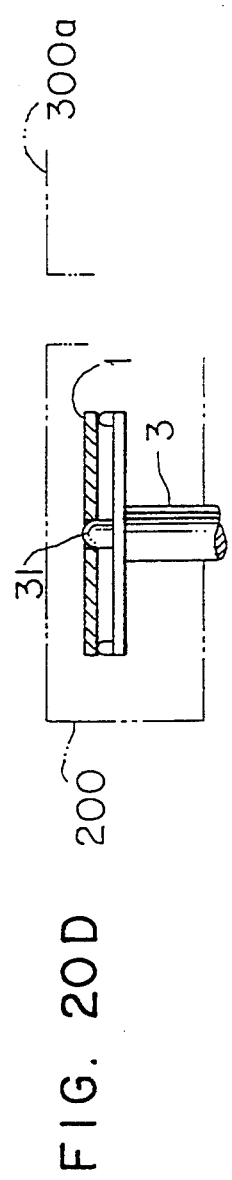

SEMICONDUCTOR WAFER PROCESSING APPARATUS

This application is a continuation of application Ser. No. 07/928,018, filed Aug. 11, 1992, now abandoned.

BACKGROUND OF THE INVENTION

The present invention relates to semiconductor wafers used in the manufacture of semiconductor devices, and apparatus for the processing of such semiconductor wafers.

Normally, oxidation and diffusion processing, CVD processing and other types of processing are used in the manufacture of semiconductor devices.

In particular, there has been recent increase in the degree of fineness of the design for semiconductor devices, where device element dimensions have changed from 0.4 $\mu$m to 0.2 $\mu$m. In addition, the semiconductor wafers themselves have been becoming larger, and have changed from 8 inches to 12 inches in diameter. One important problem is the development of technologies for fast heat treatment which can be used with technologies for the growth of extremely thin films over such a larger area on the semiconductor wafer.

More specifically, in semiconductor wafer process processing, one necessary condition is that the thermal budget (or the heat history) be made as small as possible. For example, in the growth of an extremely thin film of a capacitor insulation film or a gate oxidation film by doping processing for 50–100 Å, it is essential that the heat treatment be performed quickly, that is, in as short a time as possible.

Not only this, PN junctions for example, have been becoming as thin as 0.1 $\mu$m or less, and enabling them to have lower resistances, and the growth of junctions to surfaces of arbitrary shapes requires that the generation of crystal faults be prevented along with the deterioration of the film when the junction is made. However, the active region of PN junctions is narrow and so it is again necessary that the heat treatment be performed as quickly as possible.

In addition, in the growth of a LOCOS oxidation film for example, the synergetic effect of compression stresses in adjacent LOCOS oxidation films is magnified due to the heat cycle and it is easy for changes in the surface potential, leak currents, and reduction of the resist voltage reliability to occur. With respect to these problems, it is necessary to prevent them by reducing the heat cycle by having fast heat treatment of semiconductor wafers.

Also, when there is the use of, for example, materials having a highly dielectric compounds in the growth of a capacitor insulation films, it is necessary to have a system which enables compound process processing by enabling doping and metal film growth to enable the growth of metal oxides (such as $Ta_2O_5$ and the like) and polyamides (passivation films).

Thus, the current status of the technology is that semiconductor wafers are becoming larger from 8 inches to 12 inches, and that it is necessary to have fast and uniform heating while reducing the temperature differential between the central and the peripheral portions of the semiconductor wafer, reducing the occurrence of slip, distortion and warping which easily occur in semiconductor wafers, and to prevent them from becoming a hindrance in the manufacture of semiconductor devices.

However, in the heat treatment of a semiconductor wafer having a diameter of more than 10 inches for example, it is easy for processing gas to remain on the processing surface of the semiconductor wafer and to create problems of thermal distortion and faulty film growth to the wafer.

With respect to this, the inventors have researched the solution of these problems by improving the heat treatment apparatus for the semiconductor wafers, but also by improving the semiconductor wafer itself. Then, it was discovered that through an extremely simple configuration wherein a through hole was provided in the center portion of the semiconductor wafer which enables the prevention of residual processing gas on the processing surface of the semiconductor wafer and thus the present invention was completed.

In the field of processing of semiconductor wafers, it is necessary to increase the throughput so as to correspond to recent increases in demand and because of this, it is necessary to convey semiconductor wafers in a status of high speed and high accuracy.

In addition, the recent increase in the diameter of semiconductor wafers requires that semiconductor wafers having such large areas be conveyed suitable and at high speed.

However, semiconductor wafers have conventionally been simply loaded to a conveying apparatus and conveyed and so position discrepancies occur between semiconductor wafers when they are moved at high speed by a conveyor apparatus and there was the problem of the position accuracy deteriorating. In addition, there was also the problem of the semiconductor wafers chipping when their positions were displaced and so a conventional conveyor means involved the difficulty of conveying the semiconductor wafers at high speed, and there was no choice but to convey the semiconductor wafers at low speed.

The following is a more specific description of this, with reference to the loading fork 91 shown in FIG. 21 and which is used as the conventional means of loading the semiconductor wafers. This loading fork 91 is provided with a step 92 to load the semiconductor wafer 1 and to hold a peripheral portion of its rear side. To the peripheral portion of the step 92 is provided a protrusion 93 for positioning the semiconductor wafer 1. Then, as shown in FIG. 22, the loading fork 91 is configured so that it is mounted to the conveyor platform 95, rotationally moves in the X, Z and $\theta$ directions, takes a semiconductor wafer 1 from the wafer cassette 1a and moves it to the wafer boat 100. However, there is a slight clearance between the two so that the semiconductor wafer 1 can be easily loaded to the step 92 and so when there is conveying at high speed, it becomes difficult to completely prevent position discrepancies along the surface of the semiconductor wafer.

SUMMARY OF THE INVENTION

Therefore, an object of the present invention is the provision of a semiconductor wafer which has a structure where it is possible to perform heat treatment without film growth faults or thermal distortion.

In order to attain this objective, the semiconductor wafer of the present invention is characterized in being provided with a through hole at the center portion of the semiconductor wafer.

In the present invention, the through hole is provided at the center portion of the semiconductor wafer and so when there is heat treatment of the semiconductor wafer, the processing gas passes through that through hole and the residual processing gas on the processing surface is prevented and it is possible to have favorable film growth on the semiconductor wafer. In addition, there is no residual processing gas on the processing surface and so it is possible to prevent the generation of thermal distortion.

In addition to semiconductor wafers, the present invention can be applied to LCD and the like.

Another object of the present invention is to provide a semiconductor wafer processing apparatus which can convey semiconductor wafers accurately and at high speed.

In order to attain this objective, the semiconductor wafer processing apparatus of the present invention is a semiconductor wafer processing apparatus characterized as capable of handling a wafer having a through hole at its center portion and which is provided with a conveyor means having a holding protrusion which engages with the through hole of the semiconductor wafer.

In the present invention, there is a through hole at the center portion of a semiconductor wafer and a conveyor means having a holding protrusion which engages with that through hole conveys the semiconductor wafer. Because of this, accurate positioning is performed by the holding protrusion which engages with that through hole conveys the semiconductor wafer and there is no position discrepancy along the surface of the semiconductor wafer even when there is conveying at high speed, and it is therefore possible to have conveying with a high positioning accuracy. In addition, because there is no position discrepancy, it is possible to definitely prevent the generation of chipping of semiconductor wafers.

BRIEF DESCRIPTION OF THE DRAWINGS

FIG. 20 is a view for describing the procedure for the loading of a semiconductor wafer of the present invention to the wafer holder by the loading fork;

DETAILED DESCRIPTION OF THE PREFERRED EMBODIMENTS

The following is a description of preferred embodiments of the semiconductor wafer of the present invention.

[First Embodiment]

Figure 1:
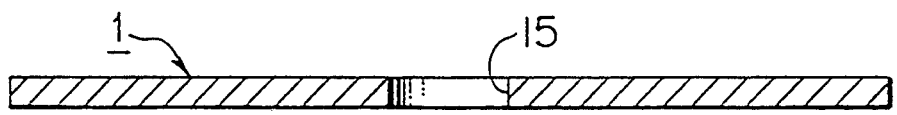
FIG. 1 is a vertical sectional view of a first embodiment of the semiconductor wafer of the present invention.

FIG. 1 is a vertical sectional view of a first embodiment of the semiconductor wafer of the present invention, and has a through hole 15 formed in the center of a semiconductor wafer 1.

The semiconductor wafer 1 is comprised of silicon, and the through hole 15 is formed circularly in its center. The size of this through hole 15 is from approximately 5 to 20 mm since the product yield will decrease if it is too large.

This through hole 15 can be formed while the silicon is still in the ingot status, or can be formed after the ingot has been sliced. In addition, the means for forming the through hole 15 can be a core drill or some other means.

Figure 2:
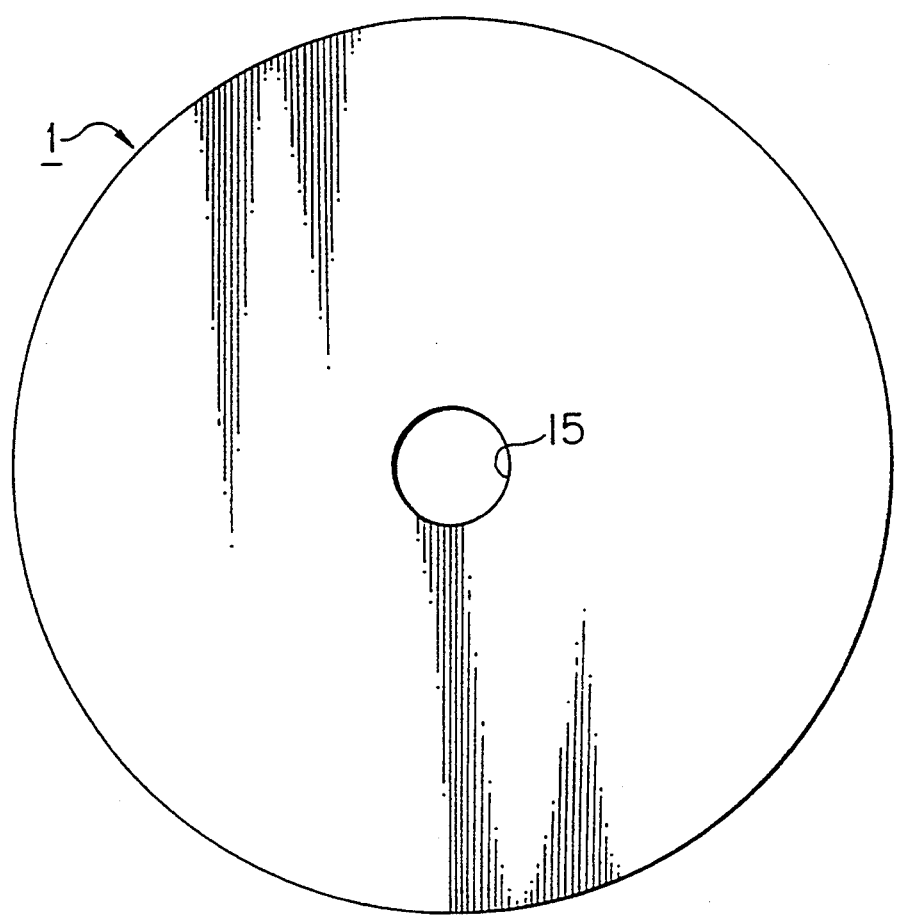
FIG. 2 is a plan view of the semiconductor wafer shown in FIG. 1.

The shape of the through hole 15 is not limited to circular, and as shown in FIG. 2 for example, can be triangular, square or some other shape instead of circular.

Figure 3:
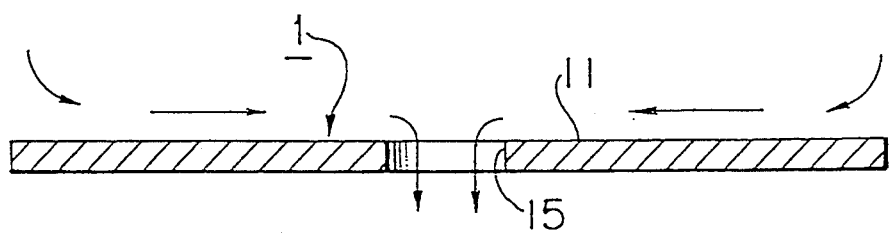
FIG. 3 is a view for describing the flow of the processing gas on the processing surface of the semiconductor wafer shown in FIG. 1.

As shown in FIG. 3, when there is the heat treatment of a semiconductor wafer 1 having this through hole 15 at its center, the processing gas (indicated in the figure by an arrow) flows along the processing surface 11 and passes through the through hole 15 so that it is possible to prevent the formation of residual processing gas to the processing surface 11, and to therefore have favorable processing performed. In addition, there is no residual processing gas on the processing surface 11 and so it is possible to prevent non-uniformity of the temperature of the processing surface 11 and to also prevent the thermal distortion from generating in the wafer.

Figure 4:
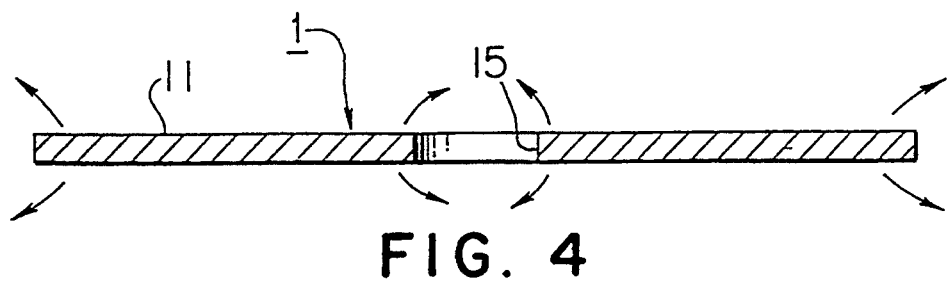
FIG. 4 is a view for describing the direction of heat discharge in a semiconductor wafer of the present invention.

In addition, as shown in FIG. 4, during the heat treatment for the semiconductor wafer 1, the dispersion of heat (shown by the arrow) from the peripheral portion of the through hole 15 is promoted. As a result of this, according to the present embodiment, there is no generation of the conventional problem of the temperature of the semiconductor wafer 1 becoming higher at the center portion, and it is possible to perform heat treatment at a uniform temperature for across the entire surface of the semiconductor wafer 1.

Figure 5:
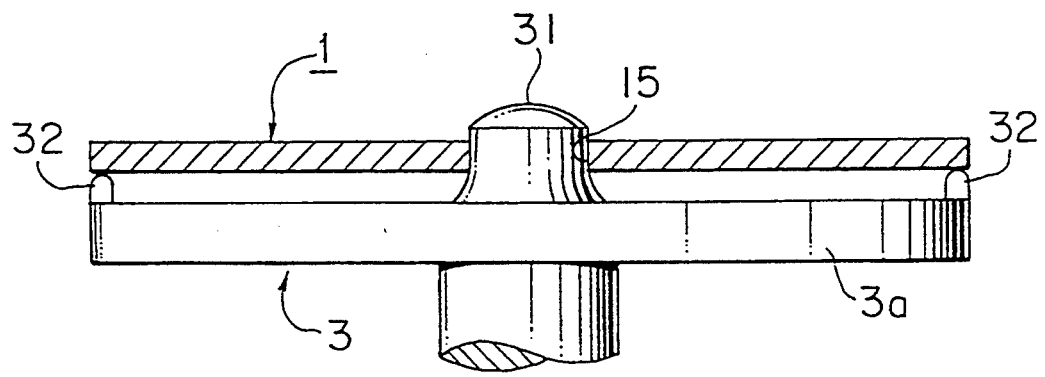
FIG. 5 is a partial vertical sectional view showing the wafer holder holding status for the semiconductor wafer of the present invention.

Furthermore, as shown in FIG. 5, it is possible to use the through hole 15 of the semiconductor wafer 1 to perform holding and positioning of the semiconductor wafer 1 and so the structure of the wafer holder 3 is extremely simple. More specifically, in a conventional semiconductor wafer which does not have a through hole at its center portion, the wafer is held by three to five holding protrusions separately provided to the side of the rear surface of the periphery of the semiconductor wafer, and positioning is performed through the provision of a stopper which opposes the outer peripheral edge of the semiconductor wafer, and the structure of the wafer holder becomes complex because of this.

However, the holding structure becomes extremely simple when the through hole 15 is used for positioning because it is not necessary to have the stopper.

In FIG. 5, the wafer holder 3 is comprised of a support shaft 31 and a support protrusion 32. The support shaft 31 has an outer diameter so that it can engage with the through hole 15. The support protrusion 32 is provided in three to five places on the head portion circular plate portion 3a of the wafer holder 3 and corresponding to positions substantially equidistant along the outer periphery of the semiconductor wafer 1, and comes into contact with the side of the rear surface of the semiconductor wafer 1 and holds the semiconductor wafer 1. In addition, to distal end of the support protrusion 32, that is, the end of the distal portion in contact with the semiconductor wafer 1, is provided a rounding of about 1.0 mm.

Figure 6:
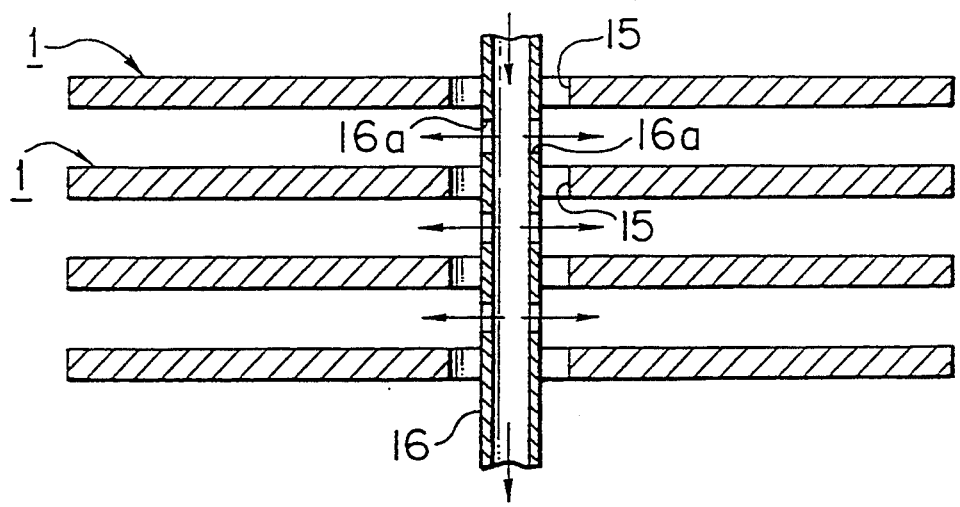
FIG. 6 is a view for describing the flow of the processing gas when a plural number of semiconductor wafers of the present invention are arranged vertically and in parallel, a nozzle is inserted into the through hole of the semiconductor wafers and heat batch processing performed.

In addition, as shown in FIG. 6, a plural number of semiconductor wafers 1 are arranged parallel to each other in the wafer boat and when batch heat treatment is performed, a nozzle 16 for the processing gas is passed through the through hole 15 in the semiconductor wafers 1 and the processing gas is supplied from the spray holes 16a of the nozzle 16 as shown in the figure, to the gap between adjacent semiconductor wafers 1,1. It is therefore possible to have a smooth flow of the processing gas. In this case, the semiconductor wafers 1 can be fixed and the nozzle 16 can rotate around its axis, or the nozzle 16 can be fixed and the semiconductor wafers 1 can be rotated.

Figure 7:
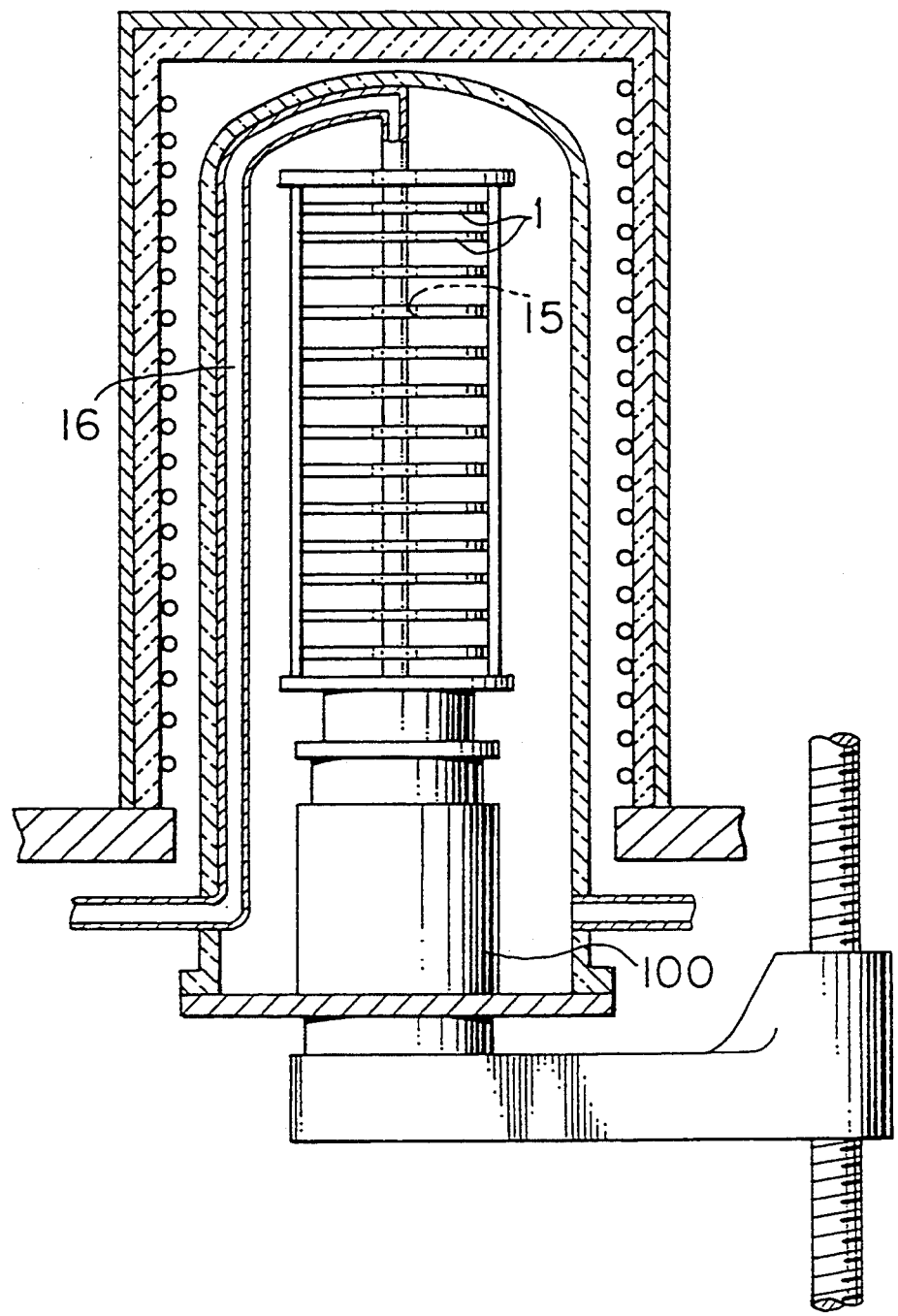
FIG. 7 is a vertical sectional view of the processing apparatus and which shows the relationship between the nozzle and the plural number of semiconductor wafers of the present invention arranged vertically and in parallel.
Figure 8:
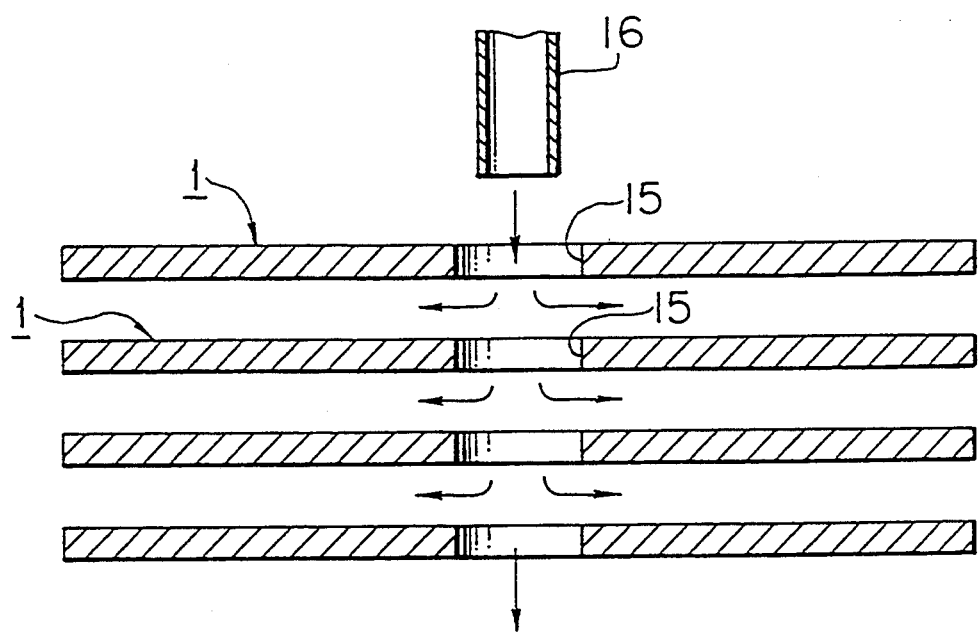
FIG. 8 is a view for describing the flow of the processing gas when a plural number of semiconductor wafers of the present invention are arranged vertically and in parallel, a nozzle is not inserted into the through hole of the semiconductor wafers and heat batch processing performed.

Furthermore, as shown in FIG. 7, the processing gas can be supplied by the nozzle from only the through hole 15 of the wafer 1 which is at the top of the plural number of semiconductor wafers 1 arranged vertically and in parallel on the wafer boat 100, and the processing gas can be supplied from each of the through holes 15 without using the nozzle, and heat treatment performed by the processing gas flowing between each of the gaps between the semiconductor wafers 1 as shown in the figure.

Also, when etching processing is performed, it is possible to have processing to a high accuracy since the flow of the etching gas is favorable.

This effect is particularly pronounced when the outer diameter of the semiconductor wafers 1 is 10 inches or more.

Figure 9:
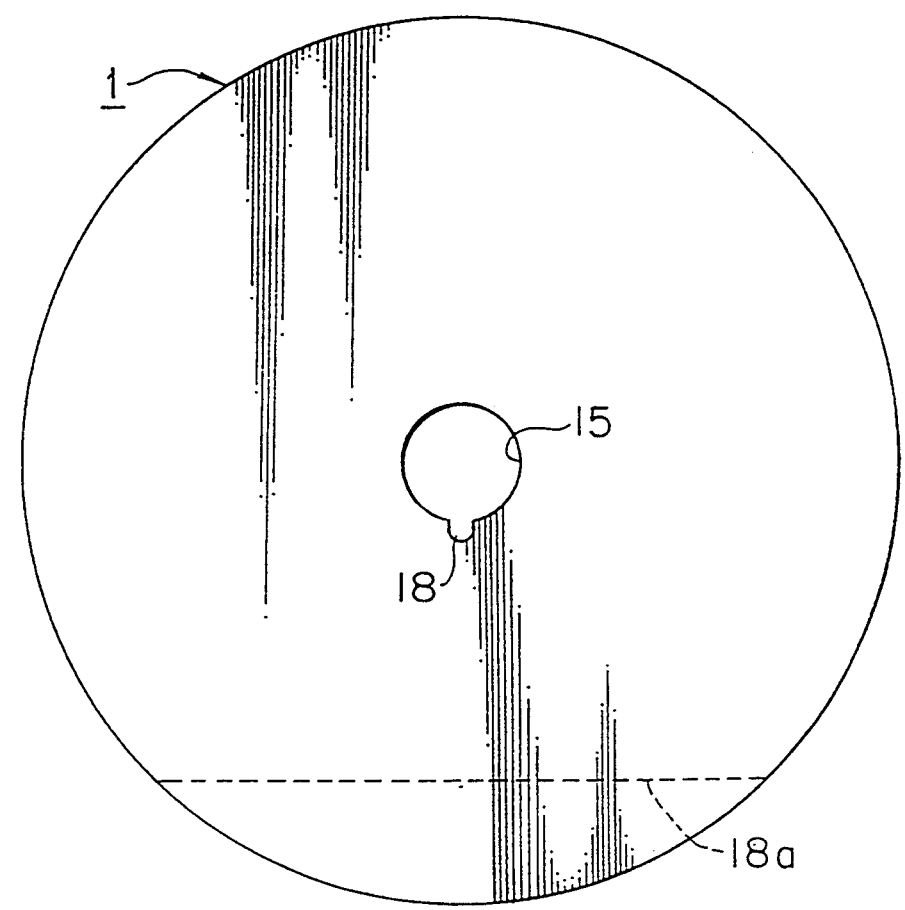
FIG. 9 is a sectional view of a second embodiment of the semiconductor wafer of the present invention.

FIG. 9 is a sectional view of a second embodiment of the semiconductor wafer of the present invention. In this embodiment, the through hole 15 is formed in an irregular shape. More specifically, the through hole 15 is shaped so as to be provided with circular notch 18 having a small diameter to the portion surrounding the through hole having a larger diameter. The small-diameter holes 18 are guides to indicate the crystal direction of the semiconductor wafer 1 for example.

Accordingly, with this embodiment, there is the effect of not requiring the special formation of notches or the like or orientation flats 18a (shown by the dotted line) to indicate the crystal direction of the semiconductor wafer 1.

In addition, instead of the small diameter holes 18 being circular, they can be formed as rectangular, triangular or wedge shapes.

The following is a description of an embodiment of the semiconductor wafer processing apparatus of the present invention.

Figure 10:
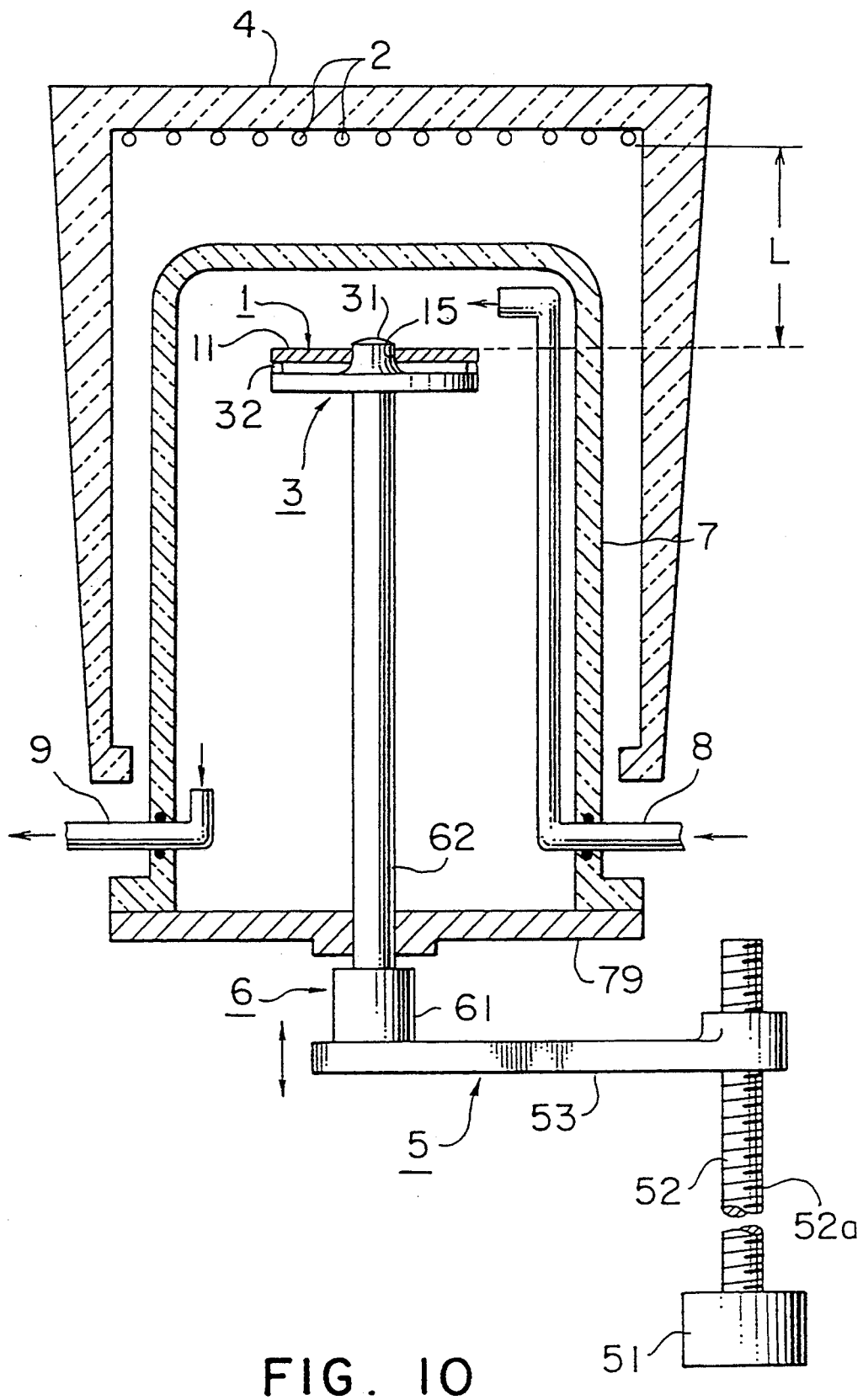
FIG. 10 is an outline vertical sectional view of a heat treatment apparatus used in oxidation and diffusion processing of a semiconductor wafer of the present invention.

FIG. 10 is an outline vertical sectional view of a heat treatment apparatus used in oxidation and diffusion processing of a semiconductor wafer of the present invention.

In this heat treatment apparatus, the through hole 15 formed in the center of the semiconductor wafer 1 engages with the distal portion 31a of the shaft 31 and which is formed as a unit with the center of the wafer holder 3, and the rear side opposite the processing surface 11 of the semiconductor wafer 1 is brought into contact with the three to five support protrusions 32 formed on the peripheral edge portion of the wafer holder 3, and therefore urge the semiconductor wafer 1 horizontal and hold it.

This wafer holder 3 is desirably formed from a material such as high-purity silicon-carbide (SiC) which has excellent heat resistance and little contamination. In particular, high-purity silicon-carbide (SiC) has a better heat resistance than silica glass ($SiO_2$) in that it can sufficiently withstand temperatures of approximately 1200° C. and is therefore suitable as a material for oxidation and diffusion processing. Furthermore, to a portion immediately above the heat treatment apparatus for example, which opposes the processing surface 11 of the semiconductor wafer 1, is a flat heat generation source 2 fixedly provided to the inner wall at the top of the heat retention material 4.

The minimum gap distance L between this flat heat generation source 2 and the semiconductor wafer 1 should be made short in view of minimizing the size of the heat treatment apparatus but should be made longer in view of having uniform heating of the entire surface of a semiconductor wafer 1 having a large area. More specifically, the distance which obtained to satisfy both of these conditions to a certain extent is in the range of 50–150 mm for example. Here, the "minimum separation distance" is the distance from the required position to the flat heat generation source 2 when there is process processing in the status where the semiconductor wafer 1 is stopped and is stationary.

This flat heat generation source 2 can be configured from Kanthal (trade name) which is an alloy wire of molybdenum silicide (MoSi$_2$), iron (Fe), chromium (Cr) and aluminum (Al), or some other resistor heat generating unit which has been made into a plate shape. In particular, it is possible for molybdenum silicide (MoSi$_2$) to sufficiently withstand high temperatures of up to approximately 1800° C. and so it is a favorable material for an apparatus for the oxidation and diffusion processing of semiconductor wafers.

In addition, it is desirable that the heat emitting surface of the flat heat generation source 2 be the same shape as the processing surface of the semiconductor wafer 1, that is, circular, and that its outer diameter be twice the outer diameter of the semiconductor wafer 1. A flat heat generation source 2 which satisfies conditions such as these can sufficiently reduce the temperature difference between the center portion and the peripheral portion of the semiconductor wafer 1 and can enable heat treatment to a uniform temperature for the entire surface of the semiconductor wafer 1. The temperature of the flat heat generation source 2 is desirably some 100°–300° C. higher than the maximum usage temperature of the semiconductor wafer 1.

The flat heat generation source 2 is driven by a heating control portion (not shown). This temperature control is performed by arranging temperature sensors (not shown) of a thermocouple or the like at suitable positions on the flat heat generation source 2, and on the basis of the detection signals from these.

In addition, a flat heating baffle member 2a (See FIG. 12) to be described later can be arranged between the flat heat generation source 2 and the semiconductor wafer 1. This flat heating baffle member 2a controls the radiated heat so that it is in the vertical direction with respect to the semiconductor wafers 1 when there are unevennesses in the heat generated in the flat heat generation source 2.

Furthermore, the flat heating baffle member 2a is configured from a material such as high purity carbon silicide (SiC) which has little contamination, and furthermore, is completely separated from the flat heat generation source 2 by a gap. By this, it is possible to effectively prevent contamination due to the heavy metals even when the flat heat generation source 2 is configured from a material which includes the heavy metals which are a source of contamination.

This flat heating baffle member 2a is arranged so as to oppose the processing surface 11 of the semiconductor wafer 1 and the outer diameter is desirably the same as that of the flat heat generation source 2 in that it is desirably two times or more the outer diameter of the semiconductor wafer 1.

In addition, this flat heating baffle member 2a is desirably thicker in the center portion than it is at the peripheral portions. Such a sectional shape reduces the heat dispersion from the peripheral portion of the semiconductor wafer 1 and enables a high uniformity of temperature to be maintained between the center portion and the peripheral portions.

Moreover, this flat heating baffle member 2a can have a curved shape for which the peripheral portion is closer to the semiconductor wafers 1. By having such a curved peripheral portion, the heat dispersion of the peripheral portion of the semiconductor wafers 1 is reduced and it is possible to have a high uniformity of temperature to be maintained between the center portion and the peripheral portions of the semiconductor wafer 1.

The movement mechanism 5 for the wafer holder 3 shown in FIG. 10 quickly raises the wafer holder 3 with respect to the flat heat generation source 2 so that it is close to it, and then quickly lowers the wafer holder 3 to remove it from the flat heat generation source 2. This mechanism is configured from a motor 51, a drive shaft 52 and a drive arm 53.

The motor 51 is coupled to the drive shaft 52 and rotational control of the drive shaft 52 is performed by the motor 51. The drive shaft 52 is provided with a screw 52a and engages with the one end of the drive arm 53 via this screw 52a. The other end of the drive arm 53 is coupled to a the wafer holder 3 via the rotating shaft 62 and the motor 61 of the rotation mechanism 6. When the motor 51 rotates the drive shaft 52, the action of the screw provided to this drive shaft 52 either raises or lowers the drive arm 53 and the wafer holder 3 is either raised or lowered by this movement of this drive arm 53. Accordingly, the control of the rotational speed of the motor 51 by the control circuit enables suitable adjustment of the speed of raising or lowering the wafer holder 3. Here, the movement distance of the wafer holder 3 is desirably between 300–600 mm for example, and the movement speed is desirably from 50–200 mm/sec or more.

The following is a description of one example of the heat processing mode in oxidation and diffusion processing. In the status where the temperature of the flat heat generation source 2 is a constant temperature of 1300° C. for example, nitrogen gas (N$_2$) is made to flow while the wafer holder 3 is raised at a speed of 200 mm/sec. for example so that the temperature of the semiconductor wafers 1 is raised from room temperature to approximately 500° C. After the semiconductor wafers 1 have reached a temperature of approximately 500° C. for example, the wafer holder 3 is raised further at a speed of 100 mm/sec. so that the temperature of the semiconductor wafers 1 reaches approximately 1200° C. After temperature of the semiconductor wafers 1 has reached approximately 1200° C., the supply of the nitrogen gas is stopped in the status where the wafer holder 3 is fixed at a required position, and there is oxidation and diffusion processing while oxygen gas (O$_2$) gas is supplied. After the completion of the oxidation and diffusion processing, a series of procedures the reverse of those described above is performed to cool the semiconductor wafers to room temperature.

During the oxidation and diffusion processing of the semiconductor wafers 1, the rotation mechanism 6 rotates the semiconductor wafers 1 around the axis of the through hole 15 so that there is uniform heating. In this rotation mechanism 6, the motor 61 rotates the semiconductor wafers 1 along with the wafer holder.

The heat retention material 4 which covers the flat heat generation source 2 and the process tube 7 is comprised of aluminum ceramic for example, and as shown in FIG. 9, decreases in thickness towards the lower portion of the process tube 7 so that can be a suitable temperature gradient along the direction of movement of the semiconductor wafers 1. More specifically, there is less of a temperature retention effect for the closer towards the bottom portion of the process tube 7.

It is desirable that the lower end portion of the heat retention material 4 be provided with a cooling means 550 (See FIG. 12) to quickly cool the semiconductor wafers 1 after the completion of heat treatment. This cooling means can use a cooling medium such as ammonia, ion disulfide, water or the like. The cooling medium uses its latent heat to cool to a temperature of approximately 300°–400° C.

The inner diameter of the heat retention material 4 is desirably determined in consideration of the temperature of the semiconductor wafers 1. For example, when the semiconductor wafers 1 have a diameter of 10 inches, the inner diameter is desirably set to approximately twice this, or to 500–600 mm.

The process tube 7 can be formed from silica glass ($SiO_2$) or the like. This process tube 7 is formed in a cylindrical shape which has an opening at its lower end, and the semiconductor wafers 1 and the wafer holder 3 are separated from the flat heat generation source 2 and the heat retention material 4 and the atmosphere of the semiconductor wafers 1 is separated from the external atmosphere.

The gas introduction tube 8 has one end protruding from the bottom portion of the process tube 7 to outside, and the other end is positioned so as to extend upwards in side the process tube 7 and to open diagonally above the semiconductor wafers 1. This gas introduction tube 8 is airtightly fixed by a screw-tightened O-ring, with respect to the wall portion of the process tube 7.

The gas exhaust tube 9 is provided to the bottom portion of the process tube 7 and so that it communicates the inside and outside of the container 7.

In the status where the wafer holder 3 is raised by the movement mechanism 5 and the semiconductor wafers 1 are completely housed inside the process tube 7, the process tube 7 is placed in a status where it is made airtight by a circular cap portion 79.

The process gas is introduced into the process tube 7 from the gas introduction tube 8 and the heat radiated from the flat heat generation source 2 makes the temperature inside the process tube 7 the required temperature necessary for oxidation and diffusion processing. The temperature inside the process tube 7 is a constant temperature if the distance from the flat heat generation source 2 is constant and so it is possible to have the required temperature (1200° C. for example) necessary for oxidation and diffusion processing by prior setting of the height position (stationary position) of the semiconductor wafers 1.

The semiconductor wafers 1 have oxidation and diffusion processing performed by reacting with the process gas while being heated.

As a result, it is possible to have heat treatment performed without the generation of slip, distortion or warping of the semiconductor wafers 1. In addition, it is also possible to have fast heat treatment which meets the requirements of semiconductor wafers of large diameters, and of fineness of the design rules for recent semiconductor devices.

Accordingly, there is a remarkable effect exhibited in various types of heat treatment such as doping processing to 50–100 Å, very thin film growth of gate oxidation films and capacitor insulation films, formation of shallow PN junctions of 0.1 μm or less, formation of LOCOS oxidation films, and other types of capacitor insulation film growth using materials having highly dielectric conductors.

Figure 11:
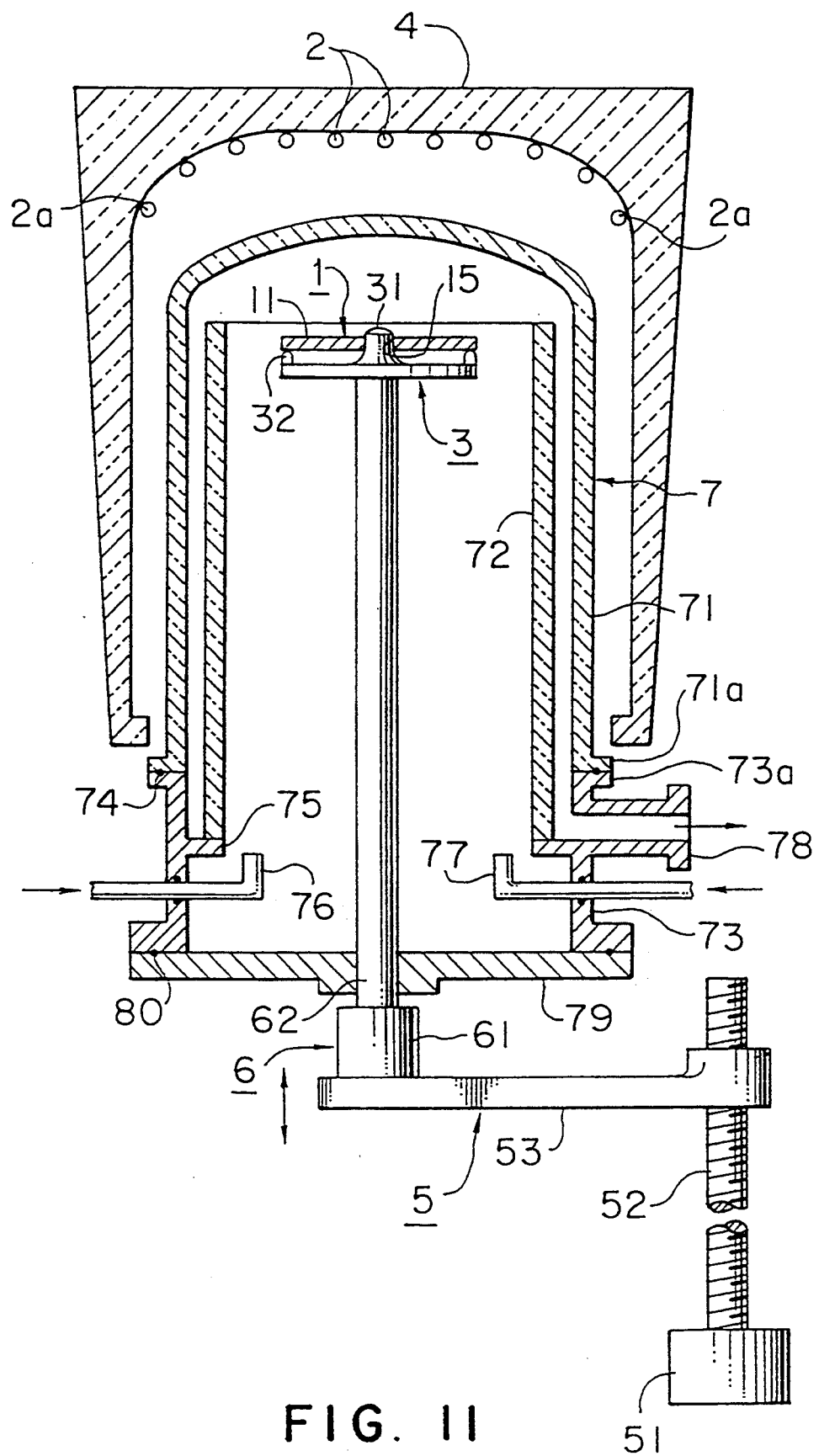
FIG. 11 is an outline vertical sectional view of a heat treatment apparatus used in CVD processing of a semiconductor wafer of the present invention.

FIG. 11 is an outline vertical sectional view of a heat treatment apparatus used in CVD processing of a semiconductor wafer of the present invention.

In this heat treatment apparatus, the wafer holder 3, movement mechanism 5 and rotation mechanism 6 have the same configuration as those of FIG. 10.

The flat heat generation source 2 has a shape wherein the peripheral edge is curved in the direction closer to the semiconductor wafers 1. This controls the heat discharge of the peripheral portion of the semiconductor wafer 1 and makes the temperature more uniform across the entire surface of the semiconductor wafers 1. The inner wall of the upper portion of the heat retention material 4 is shaped so as to receive the curved peripheral edge portion of the flat heat generation source 2.

Here, the process tube 7 has a double-tube structure provided with an outer tube 71 and an inner tube 72, with the outer tube 71 comprised of a heat resistant material such as silica glass ($SiO_2$), with the upper end closed and the lower end having a cylindrical shape with an opening. The inner tube 72 is cylindrical in shape with openings at both the upper and the lower end, and is arranged on the same axis and with a gap between it and the outer tube 71.

The gas which rises from the upper portion opening of the inner tube 72 passes through the gap between the inner tube 72 and the outer tube 71 and is exhausted to the outside.

The bottom opening of the outer tube 71 and the inner tube 72 engage with a manifold 73 which is comprised of stainless steel or the like, and the outer tube 71 and the inner tube 72 are held by this opening. This manifold 73 is fixed to a base (not shown).

The end portion of the upper portion opening of the manifold 73 and the lower portion of the outer tube 71 are respectively provided with ring flanges 71a and 73a, with an O-ring 74 of a pliant material being placed between the flanges 71a, 73a and airtightly sealing between the two. The lower end portion of the inner tube 72 is held by a holding portion 75 formed so as to protrude from the middle stage to the inside of the inner wall of the manifold 73.

A first gas introduction pipe 76 comprised of silica glass for example, and which is curved in the direction of the heat treatment portion towards the top, passes through one side of the lower portion of the manifold 73 via a sealing member (not shown), and supplies a film growth gas such as dichloryl-silane ($SiH_2Cl_2$) to the inside of the process tube 7. This first gas introduction pipe 76 is connected to a gas supply source (not shown).

A second gas introduction pipe 77 comprised of silica glass for example, and which is curved in the direction of the heat treatment portion towards the top, passes through another side of the lower portion of the manifold 73 via a sealing member (not shown), and supplies a film growth gas such as ammonia ($NH_3$) to the inside of the process tube 7. This second gas introduction pipe 77 is connected to a gas supply source.

To the upper portion of the manifold 73 is connected an exhaust pipe 78 which is connected to a vacuum pump (not shown), and which exhausts the processing gas which flows down the gap between the outer tube 71 and the inner tube 72, to outside of the system so that the inside of the process tube 7 is set to a required reduced pressure atmosphere.

To the opening of the lower end of the manifold 73 is detachably mounted a circular cap portion 79 of stainless steel or the like, via an O-ring 80 of a pliant material and so as to be airtight.

To substantially the center portion of this circular cap portion 79 passes a rotating shaft 62 which can rotate in an airtight status because of a magnetic seal or the like. This rotating shaft 62 is a rotating shaft of the wafer holder 3 and to its lower portion is connected a motor 61 to rotate it at a required speed. This motor 61 is fixed to a drive arm 53 of a movement mechanism 5 so that the raising and lowering of the drive arm 53 raises and lowers the cap portion 79 and the rotating shaft 62 as a unit, and loads and unloads the wafer holder 3 to and from the inside of the process tube 7.

The following is a description of the CVD processing operation using the heat treatment apparatus shown in FIG. 11.

First, the wafer holder 3 is lowered by the movement mechanism 5 and unloaded. One semiconductor wafer 1 is held in the wafer holder 3. After this, the flat heat generation source 2 is driven and heat is generated, and the atmosphere at the highest position of the wafer holder 3 is heated to a uniform temperature of 700° C. for example.

Then, the movement mechanism 5 raises the wafer holder 3 so that it is loaded to the inside of the process tube 7 and the internal temperature of the process tube 7 is maintained at 700° C. for example. Then, after the inside of the process tube 7 has been exhausted to a required vacuum status, the rotation mechanism 6 rotates the wafer holder 3 and also rotates the semiconductor wafer 1 held on top of it. At the same time, a film growth gas such as dichloryl-silane ($SiH_2Cl_2$) gas is introduced from the first gas introduction pipe 76 and a film growth gas such as ammonia ($NH_3$) is introduced from the second gas introduction pipe 77. The supplied film growth gases rise inside the process tube 7 and are supplied from the top of the semiconductor wafer 1 and uniformly with respect to the semiconductor wafer 1. The inside of the process tube 7 is exhausted via the exhaust pipe 78 and the pressure is controlled to within a range of 0.1–0.5 Torr, and is for example. 0.5 Torr, and film growth is performed for the required time.

When there is the completion of film growth processing to the semiconductor wafer 1 in this manner, there is the replacement of the processing gas inside the process tube 7 with an inert gas such as $N_2$ or the like so that there can be shift to film growth processing for the next semiconductor wafer 1, and the internal pressure is raised to normal pressure. After this, the movement mechanism 5 lowers the wafer holder 3 and the wafer holder 3 and the processed semiconductor wafer 1 are taken from the process tube 7. The processed semiconductor wafer 1 on the wafer holder 3 which has been unloaded from the process tube 7 is exchanged with an unprocessed semiconductor wafer which is loaded into the process tube 7 and has film growth processing performed to it in the same manner as described above.

Moreover, in the heat treatment apparatus shown in FIG. 11, the wafer holder 3 can be fixed and the flat heat generation source 2 is raised and lowered.

When the wafer holder 3 is fixed in this manner, there is less mechanical impact received by the semiconductor wafers 1 and so it is possible to have no damage to the thin film on the semiconductor wafer 1, and furthermore, the mechanism of the heat treatment apparatus can be simplified since it is not necessary to move the manifold.

In addition, when the processed semiconductor wafers 1 are taken out, the flat heat generation source 2, the heat retention material 4 and the outer tube 71 can be raised first raised, and then the inner tube 72 raised.

[Third Embodiment]

The following is a description of a processing apparatus for performing oxidation and diffusion processing to a semiconductor wafer of the present invention.

Figure 12:
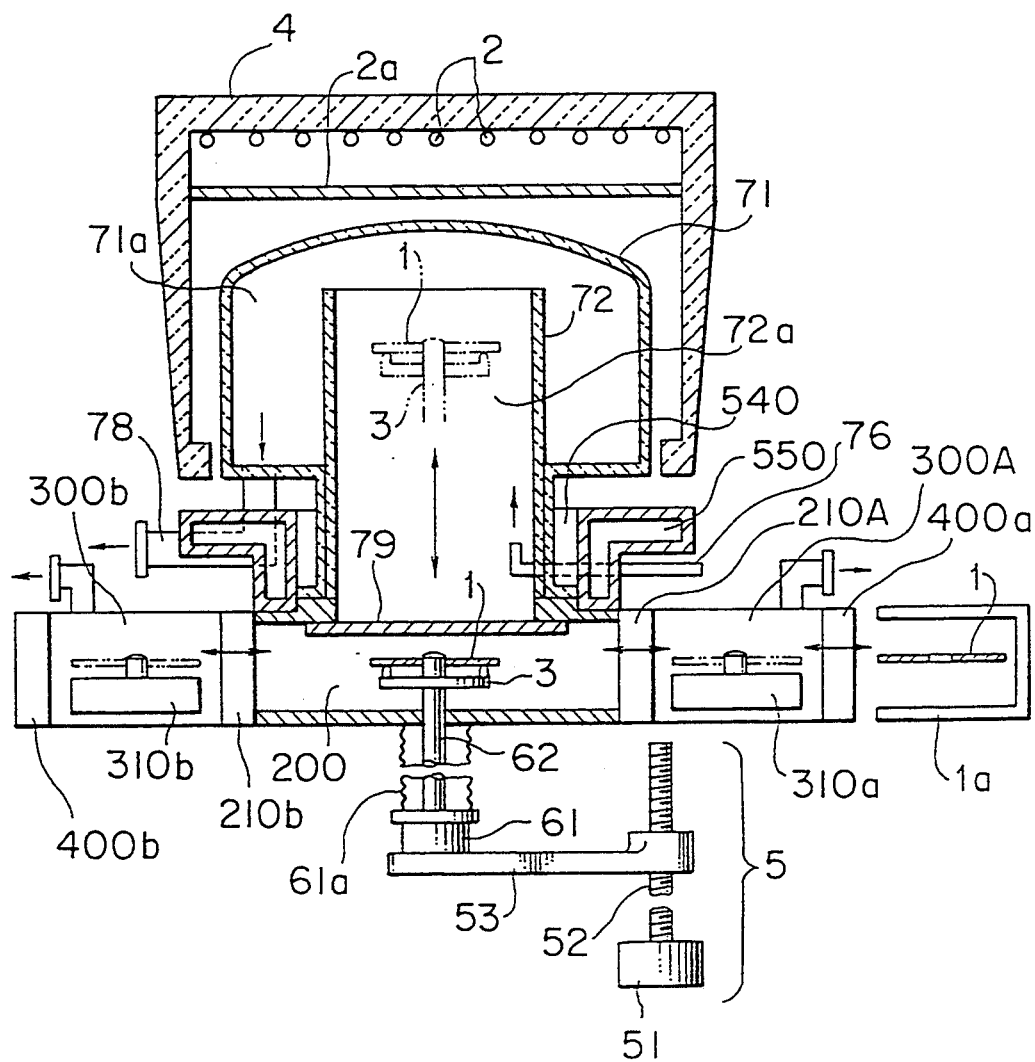
FIG. 12 is a vertical sectional view of an oxidation and diffusion apparatus used in the processing of a semiconductor wafer of the present invention.

FIG. 12 is a vertical sectional view of an oxidation and diffusion apparatus used in the processing of a semiconductor wafer of the present invention, and is configured from a process tube 72a, a pre-processing chamber 200, pre-vacuum chambers (load-lick chamber) 300a and 300b, a semiconductor wafer housing chamber (wafer cassette) 1a, an outer tube 71, and inner tube 72, a first gas introduction pipe 76, a exhaust pipe 78, a flat heat generation source 2, a flat heating baffle member 2a, heat retention material 4, an auxiliary heating source 540, a cooling means 550, a wafer holder 3, and a raising and lowering (movement) means 5 and the like.

The process tube 72a is configured from an outer tube 71 comprised of high-purity silica glass ($SiO_2$) for example, and to the inner side of the outer tube 71 is arranged an inner tube 72 comprised of high-purity silica glass ($SiO_2$) for example. To a lower portion of the outer tube 71 and the inner tube 72 is connected a first gas introduction pipe 76 for introducing the process gas to inside the process tube 72a. The process gas which is supplied to inside the process tube 72a from the first gas introduction pipe 76 processes the semiconductor wafer 1 which has been raised inside the inner tube 72, then passes through the gap between the outer tube 71 and the inner tube 72 and is exhausted from the exhaust pipe 78 connected to the outer tube 71. Moreover, when the process gas flows in the opposite direction, 78 becomes the gas introduction pipe and 76 becomes the gas exhaust pipe.

Figure 13:
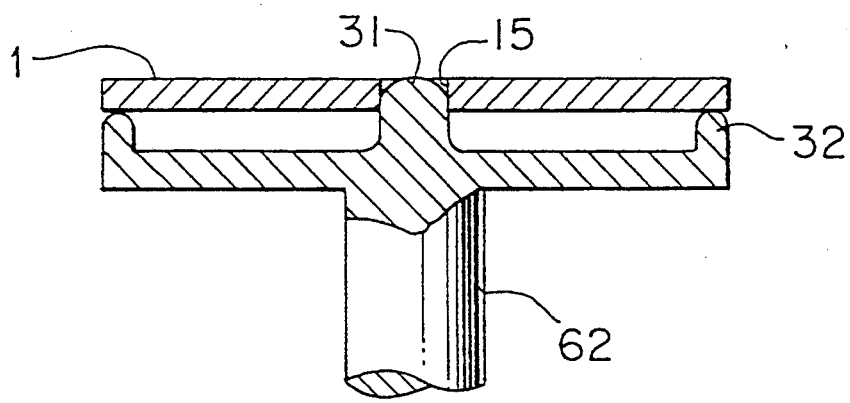
FIG. 13 is a view describing the status when a semiconductor wafer of the present invention is held by a wafer holder.

A wafer holder 3 is arranged inside the inner tube 72. This wafer holder 3 is one configuration of a conveyor means. As shown in FIG. 13, there are provided a shaft 31 which engages with a through hole 15 of the semiconductor wafer 1 which has the through hole 15 in its center portion, and a holding protrusion 32 which holds a peripheral portion of a rear surface of a semiconductor wafer 1.

Figure 14:
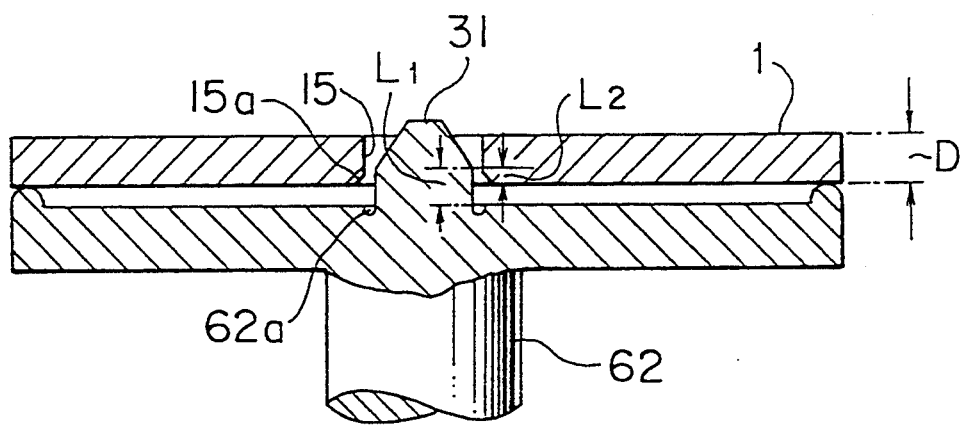
FIG. 14 is a partial enlarged view of a semiconductor wafer and the wafer holder of FIG. 13.

As shown in detail in FIG. 14, the distal end portion of the shaft 31 is desirably tapered so as to smoothly engage the through hole 15 of the semiconductor wafer. In this case, the length L1 of the straight portion is one- to two-thirds the thickness of the semiconductor wafer 1.

In addition, when the support shaft 31 engages with the through hole 15, it is desirable that a gap of 0.1 to 0.2 mm be formed between the straight portion of the support shaft 31 and the side wall of the through hole 15. There are many instances where it is difficult to process the base of the support shaft 31 to a right angle (90°) and so it is desirable to provide an indented portion 62a.

The portion close to the side of the rear surface of the through hole 15 of the semiconductor wafer 1 is desirably cut to a larger diameter. More specifically, the entrance opening of the through hole 15 widens and so the engagement of the support shaft 31 is facilitated. The length L2 of this cut portion 15a is from one- to two-sixths the thickness D of the semiconductor wafer 1.

The raising and lowering (movement) mechanism 5 moves the wafer holder 3 up and down between the process tube 72a and the pre-processing chamber 200.

The raising and lowering mechanism 5 is comprised of a rotation motor 61 which rotates the shaft 62 of the wafer holder 3, an arm 53 which holds the rotation motor 61, a drive shaft 52 which engages with this arm 53 and moves it up and down, and a drive motor 51 which rotates the drive shaft 52. A tube 61a of a spiral thread shape and comprised of SiC for example, is provided so as to seal the wafer holder 3 from the external atmosphere and to maintain airtightness. A cover member 79 provided so as to be movable is provided so as to seal the process tube 72a when the wafer holder 3 is lowered and is positioned inside the pre-processing chamber 200.

To both sides of the pre-processing chamber 200 are arranged pre-vacuum chambers 300a, 300b via the gate valves 210a, 210b. These pre-vacuum chambers 300a, 300b have movement means 310a, 310b respectively arranged to them in order to convey the semiconductor wafer 1.

Figure 15:
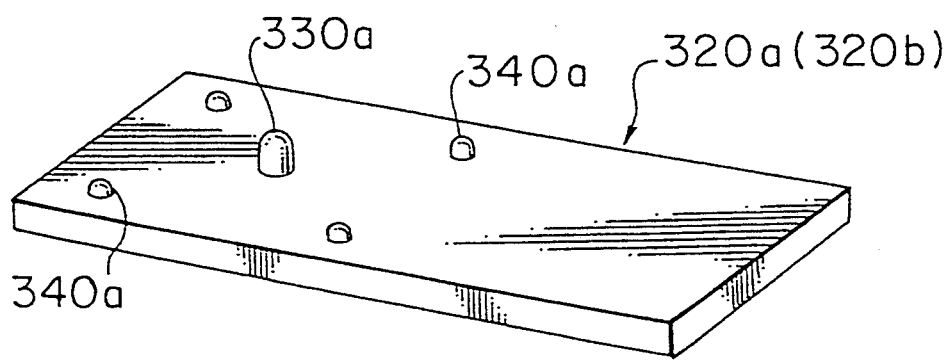
FIG. 15 is a perspective view showing a first embodiment of the loading fork of the oxidation and dispersion apparatus shown in FIG. 12.

These movement means 310a, 310b form one conveyor means for the semiconductor wafers 1. More specifically, as shown in FIG. 15, one of the movement means 310a is provided with a movement fork 320a which has a holding protrusion 330a which engages with the through hole 15 of the semiconductor wafer 1. The protrusion 340a which holds the rear surface of the semiconductor wafer 1 is provided to the top surface of the movement fork 320a.

Figure 22:
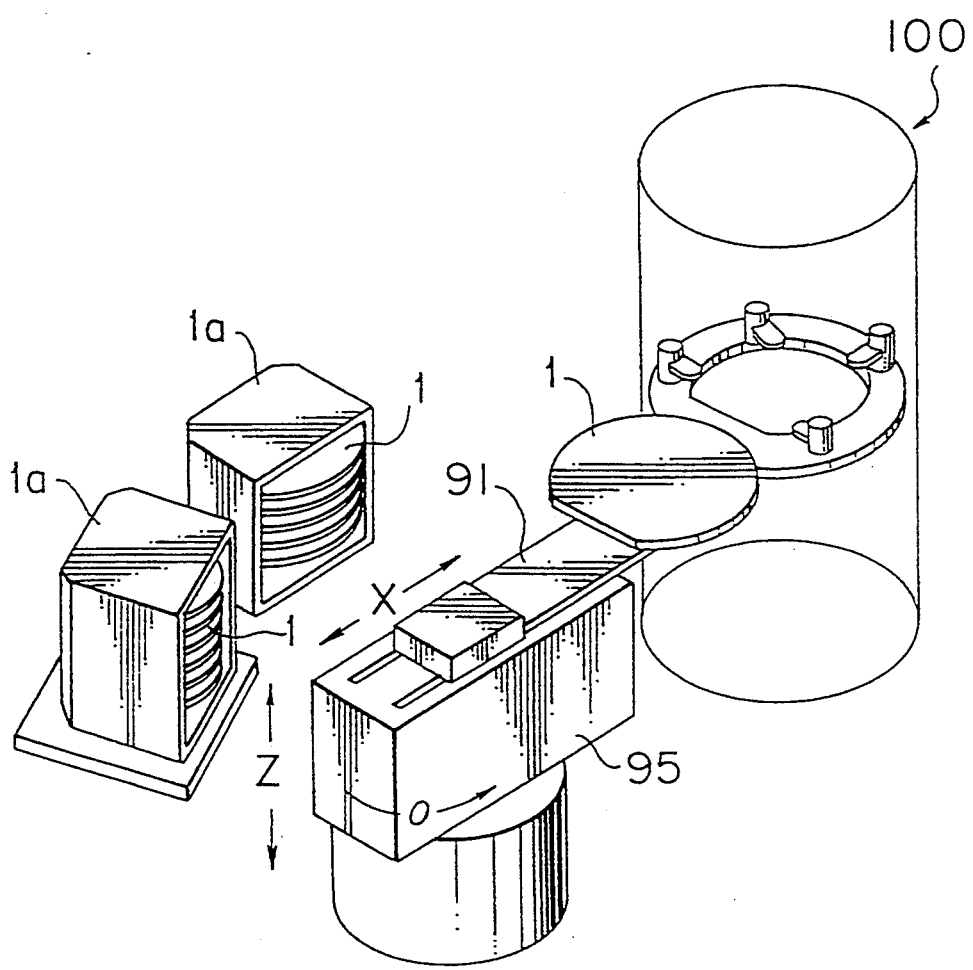
FIG. 22 is an outline perspective view showing a conventional semiconductor wafer conveyor apparatus.

Such a movement fork 320a enables the conveyor means to be more compact than a conventional means because the through hole 15 formed in the center of the semiconductor wafer 1 is accurately positioned by the holding protrusion 330a which is provided to the center portion. More specifically, as shown in FIG. 22, the conventional movement fork must hold the peripheral portion of the rear surface of the semiconductor wafer 1 and so it is necessary for it to have a length greater than the outer diameter of the semiconductor wafer 1. However, with the movement fork shown in FIG. 15, it is not necessary to hold the peripheral portion of the rear surface of the semiconductor wafer 1 and so it can be shorter than the outer diameter of the semiconductor wafer 1.

In addition, the other movement means 310b also has a movement fork 320b the same as that shown in FIG. 15.

Figure 16:
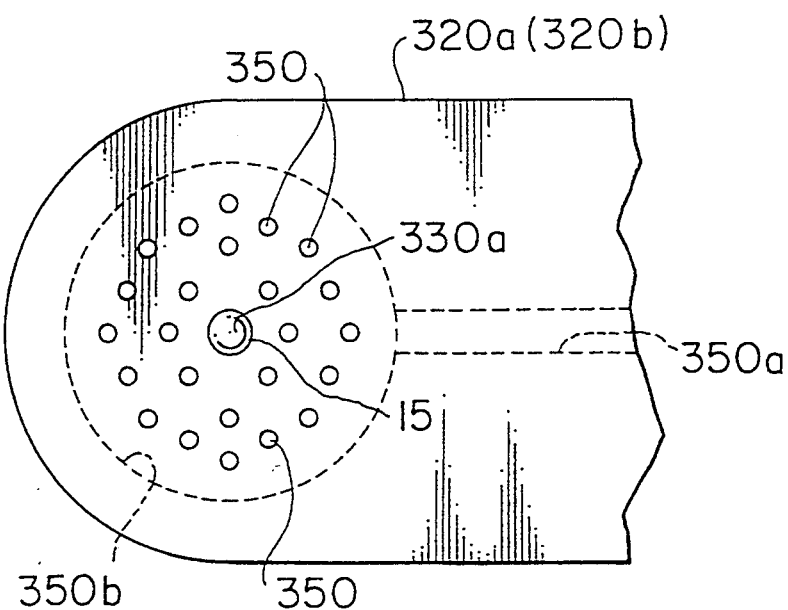
FIG. 16 is a plan view showing a second embodiment of the loading fork.
Figure 17:
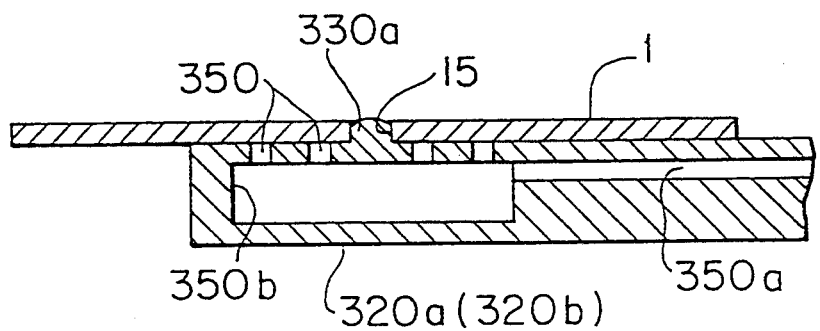
FIG. 17 is a vertical sectional view of the loading fork shown in FIG. 16.

The movement forks 320a, 320b shown in FIG. 15 can have a means attached for the suction holding of a semiconductor wafer 1. For example, as shown in FIG. 16 and FIG. 17, many suction holes 350 are provided to the holding surface of the movement fork 320a, and the suction force of a vacuum pump (not shown) acts through these suction holes 350 via an air pool 350b and a suction path 350a so that the rear side of a semiconductor wafer 1 positioned by the holding means 330a can be forcibly sucked and held.

Figure 18:
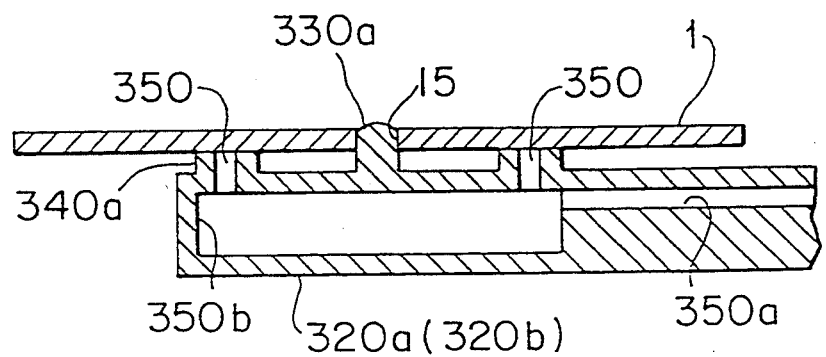
FIG. 18 is a vertical sectional view showing a third embodiment of the loading fork.

In addition, as shown in FIG. 18, the semiconductor wafer 1 can be sucked and held by providing suction holes 350 to the protruding portion 340a formed in the movement fork 320a.

Furthermore, as shown in FIG. 12, to the outer side of the pre-vacuum chambers 300a, 300b are provided gate valves 400a, 400b.

To the outer side of one of the gate value 400a is arranged a semiconductor wafer housing container (a wafer cassette) 1a for a plural number such as 25 semiconductor wafers 1 arranged in parallel. This housing container 1a can have a conventional configuration whereby it holds only the peripheral portion of the semiconductor wafers 1, or it can have a configuration provided with a holding protrusion to engage the through holes 15 of the semiconductor wafers 1. In this case, it is possible to convey the semiconductor wafers 1 through the use of a lifting means.

The following is a description of the method of conveying the semiconductor wafers 1 of the present invention, using the movement means of the present embodiment.

When the semiconductor wafers 1 housed in the housing container 1a are conveyed to inside the process tube 72a, the gate value 400a is opened and the movement means 310a arranged to one of the pre-vacuum chambers 300a, moves the semiconductor wafers 1 from the housing container 1a to that pre-vacuum chamber 300a.

Figure 19A:
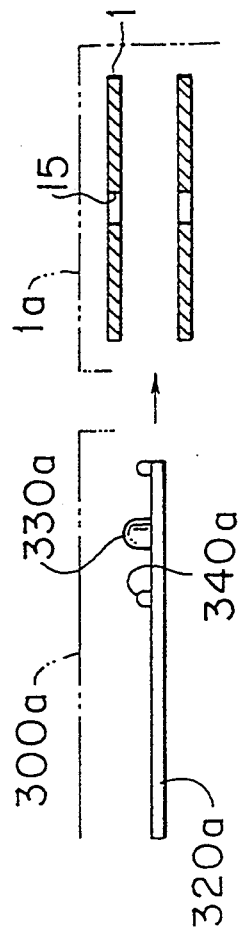
FIG. 19 is a view for describing the procedure for the conveying of a semiconductor wafer of the present invention from a housing container (wafer cassette) to the vacuum pre-chamber.
Figure 19B:
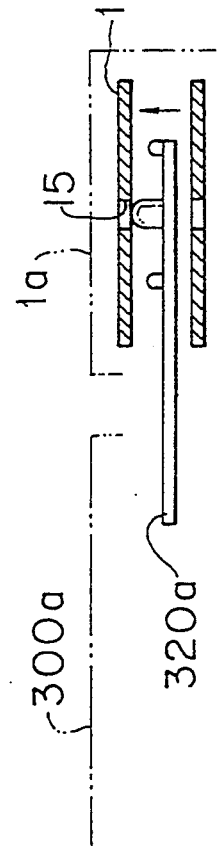
Figure 19C:
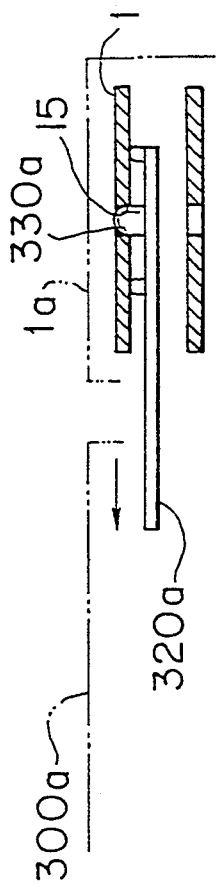
Figure 19D:
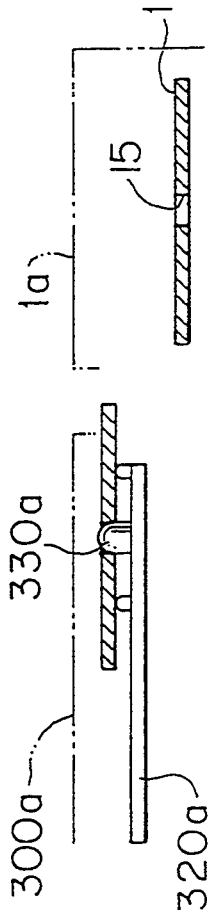
Figure 21:
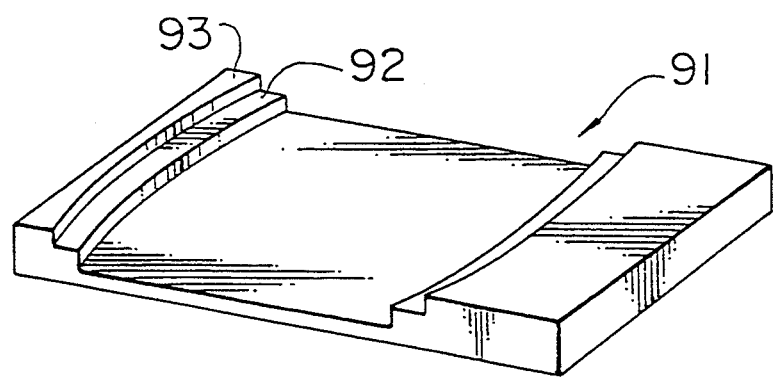
FIG. 21 is a perspective view showing a conventional loading fork.

To describe this conveying method in more detail, as shown in FIG. 19A, the movement fork 320a of the movement means 310a is inserted inside the housing container 1a. Then, as shown in FIG. 19B, this movement fork 320a is raised slightly and the semiconductor wafer 1 is lifted up from beneath so that as shown in FIG. 19C, the holding protrusion 330a of the movement fork 320a engages with the through hole 15 of the semiconductor wafer 1. Furthermore, the movement fork 320a is retreated and as shown in FIG. 19D, is positioned inside the pre-vacuum chamber 300a.

Then, the gate valve 400a is closed and the inside of the pre-vacuum chamber 300a is exhausted, the gate valve 210a is opened and the movement fork 320a is rotated and conveyed to a required position in the pre-processing chamber 200 as shown in FIG. 20A.

After this, the semiconductor wafer 1 which is positioned inside the pre-processing chamber 200 is moved to the wafer holder 3 which is waiting in the pre-processing chamber 200. More specifically, as shown in FIG. 20B, the wafer lifting means (not shown) is used to slightly lower the movement fork 320a in the status where it holds the peripheral portion of the semiconductor wafer 1 and to retreat the movement fork 320a to its original position in the pre-vacuum chamber 300a. The gate valve 210 is then closed.

Furthermore, in the status where the semiconductor wafer is held by the wafer lifting means, the wafer holder 3 is raised from below as shown in FIG. 20C, and the support shaft 31 of the wafer holder 3 is engaged with the inside of the through hole 15 of the semiconductor wafers 1 as shown in FIG. 20D. In this manner, after the semiconductor wafer 1 has been moved to the wafer holder 3, the cover member 79 is opened, and the wafer holder 3 is quickly raised by the movement mechanism 5, is stopped at a required position inside the process tube 72a and oxidation and dispersion processing of the semiconductor wafer 1 is performed.

When this oxidation and diffusion processing has finished, the cover member 79 is opened, and the wafer holder 3 is lowered to the pre-processing chamber 200 by the movement mechanism 5. The processed semiconductor wafer 1 is then either returned to the original housing container 1a via the pre-vacuum chamber 300a or is conveyed to another pre-vacuum chamber 300b and is conveyed to a housing container (not shown) which is arranged externally.

The oxidation and diffusion processing of one semiconductor wafer 1 is then finished. The following are the effects obtained by the semiconductor wafer processing apparatus according to the present invention.

(1) A wafer holder 3 has a structure which has a support shaft 31 which engages with a through hole 15 in a semiconductor wafer 1 and so engaging this support shaft 31 with a through hole 15 of a semiconductor wafer 1 enables a semiconductor wafer 1 to be accurately positioned and held at a required position, and also for there to be no position discrepancies when the wafer holder 3 is moved up and down at high speed.

(2) According to the movement fork shown in FIG. 15, there is a holding protrusion 330a which engages with a through hole 15 of a semiconductor wafer 1 and so engaging this holding protrusion 330a with a through hole 15 of a semiconductor wafer 1 and moving the semiconductor wafer 1 enables the position of the semiconductor wafer 1 to be always at a required position with respect to the movement fork 320a, and for the loading of the semiconductor wafer 1 to always be at a required position. Because of this, there are no position discrepancies along the surface of the semiconductor wafer 1 when the semiconductor wafer 1 is moved at high speed, and there is no chipping of the semiconductor wafer 1.

(3) According to the movement fork 320a shown in FIG. 16, FIG. 17 and FIG. 18, the semiconductor wafer 1 can also be held by suction holes and position discrepancies further prevented.

(4) Furthermore, when the housing container 1a has a structure provided with a holding protrusion which engages with a through hole 15 of a semiconductor wafer 1, the entire conveying process for from the housing container 1a to the wafer holder 3 always conveys the semiconductor wafer 1 to a required position, improves the position accuracy of conveyance, and allows high-reliability processing to be performed.

This has been a description based on embodiments of the present invention but the semiconductor wafer processing apparatus of the present invention is also applicable to a wide range of processing such as thin film formation (spattering, CVD, etc.), oxidation, doping (heat diffusion, ion injection and the like), annealing, resist processing (application, developing and the like), exposure, etching, washing, and others.

According to a semiconductor wafer processing apparatus of the present invention, it is possible to convey semiconductor wafers at high speed and with high precision.

What is claimed is:

1. A processing apparatus for movement of a semiconductor wafer which has a through hole at a center portion thereof, said apparatus comprising:
    a wafer movement fork;
    a shaft; and
    a wafer holder centrally mounted on said shaft for receiving semiconductor wafers from said wafer movement fork, said shaft partially protruding through said wafer holder, said wafer holder having a circumferential portion including at least three support protrusions thereon, whereby a semiconductor wafer received from said fork is mounted on said wafer holder and maintained in a horizontal position by inserting said shaft into the through hole of the received wafer until said support protrusions abut an under-surface of the wafer.

2. The processing apparatus of claim 1, wherein said processing apparatus is a vertical type heat treatment apparatus.

3. The processing apparatus of claim 1, wherein said processing apparatus is a CVD apparatus.

4. The processing apparatus of claim 1, further having means for orienting a wafer on said wafer holder by utilizing a notch formed in a peripheral portion of the wafer through hole.

5. The processing apparatus of claim 1, wherein said shaft has a tapered end portion, for extending through the through hole of a received wafer from a side opposite of a side of the wafer to be processed.

6. The processing apparatus of claim 1, wherein said wafer movement fork has a holding surface with a plurality of suction holes therein.

7. The processing apparatus of claim 1, wherein said wafer movement fork has at least three protruding portions and each of said protruding portions has a suction hole.

* * * * *